(12) United States Patent
Nagahama et al.

(10) Patent No.: US 7,608,821 B2
(45) Date of Patent: Oct. 27, 2009

(54) SUBSTRATE INSPECTION APPARATUS, SUBSTRATE INSPECTION METHOD AND SEMICONDUCTOR DEVICE MANUFACTURING METHOD

(75) Inventors: Ichirota Nagahama, Koga (JP);
Yuichiro Yamazaki, Tokyo (JP);
Atsushi Onishi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 337 days.

(21) Appl. No.: 11/698,132

(22) Filed: Jan. 26, 2007

(65) Prior Publication Data
US 2007/0194232 A1  Aug. 23, 2007

(30) Foreign Application Priority Data
Feb. 13, 2006  (JP)  .............................. 2006-035297

(51) Int. Cl.
*H01J 37/26* (2006.01)
*G01N 23/04* (2006.01)

(52) U.S. Cl. ..................... 250/310; 250/306; 250/307; 250/309; 250/311; 250/492.1; 250/492.2; 250/492.3

(58) Field of Classification Search .................. 250/306, 250/307, 309, 310, 311, 396 R, 399, 423 R, 250/424, 492.1, 492.2, 492.21, 492.3; 850/17, 850/22
See application file for complete search history.

(56) References Cited

U.S. PATENT DOCUMENTS

| | | | |
|---|---|---|---|
| 5,576,833 A | | 11/1996 | Miyoshi et al. |
| 5,990,476 A | * | 11/1999 | Larson et al. ............... 250/251 |
| 6,803,571 B1 | * | 10/2004 | Mankos et al. .............. 250/310 |
| 7,205,539 B1 | * | 4/2007 | Schmidt et al. ............. 250/310 |
| 2003/0015657 A1 | * | 1/2003 | Takada et al. ............... 250/288 |
| 2004/0108458 A1 | * | 6/2004 | Gerlach et al. .............. 250/311 |
| 2004/0113100 A1 | * | 6/2004 | Keum et al. ............ 250/492.21 |
| 2005/0176159 A1 | * | 8/2005 | Kang ......................... 438/14 |
| 2005/0279934 A1 | * | 12/2005 | Stewart et al. .............. 250/310 |

FOREIGN PATENT DOCUMENTS

| | | | |
|---|---|---|---|
| JP | 04-242060 | | 8/1992 |
| JP | 7-249393 | | 9/1995 |
| JP | 2002-222635 | | 8/2002 |
| JP | 2002222635 | * | 8/2002 |

OTHER PUBLICATIONS

Tsuno, K., "Simulation of a Wien Filter as Beam Separator in a Low Energy Electron Microscope," Ultramicroscopy, vol. 55, pp. 127-140, (1994).

* cited by examiner

*Primary Examiner*—Jack I Berman
*Assistant Examiner*—Nicole Ippolito Rausch
(74) *Attorney, Agent, or Firm*—Finnegan, Henderson, Farabow, Garrett & Dunner, L.L.P.

(57) ABSTRACT

A substrate inspection apparatus includes: an electron gun which generates an electron beam to irradiate the electron beam to a substrate; an electron detection unit which detects at least one of a secondary electron, a reflection electron and a back scattering electron generated from a surface of the substrate by the irradiation of the electron beam to output signals constituting an image showing a state of the substrate surface; and a surface potential uniformizing unit which generates ions, and irradiates the ions to the substrate before the irradiation of the electron beam to uniformize a surface potential of the substrate.

16 Claims, 7 Drawing Sheets

SUBSTRATE INSPECTION APPARATUS, SUBSTRATE INSPECTION METHOD AND SEMICONDUCTOR DEVICE MANUFACTURING METHOD

CROSS REFERENCE TO RELATED APPLICATION

This application claims benefit of priority under 35USC §119 to Japanese patent application No. 2006-35297, filed on Feb. 13, 2006, the contents of which are incorporated by reference herein.

BACKGROUND OF THE INVENTION

1. Field of the Invention

The present invention relates to a substrate inspection apparatus, a substrate inspection method and a semiconductor device manufacturing method.

2. Related Background Art

Techniques using an electron beam have been used in defect inspections of semiconductor patterns. Specifically, a technique has been proposed wherein a rectangular electron beam is formed by electron irradiation unit and irradiated to a sample as a primary beam, and at least one of a secondary electron, a reflection electron and a back scattering electron (hereinafter referred to as a "secondary electron, etc.") generated on the surface of the sample is projected as a secondary beam in an expanded form to an electron detector by a projection optical system, such that an image of the surface of the sample is obtained (e.g., Japanese patent laid open (kokai) 7(1995)-249393. In addition to the technique described in Japanese patent laid open (kokai) 7(1995)-249393, a method has also been proposed wherein a primary beam is deflected by a Wien filter which is an electromagnetic/magnetic superposed deflector to cause the primary beam to vertically enter the surface of a sample, and a secondary beam is also caused to travel straight within the same Wien filter to introduce the secondary beam into projection optics.

However, if, for example, an apparatus disclosed in Japanese patent laid open (kokai) 2002-222635 is used to irradiate a primary beam to a sample, a local difference is produced in the potential of the surface of the sample in accordance with the shape and material of the sample surface or of a layer in the vicinity of the surface. Even before the irradiation of the primary beam, a local difference is also produced in the potential of the surface in accordance with a condition in which the sample surface is charged.

For example, in the sample surface of an integrated circuit wafer in which a metal wiring line part and an inter-wiring-line insulator part coexist, a local potential gradient which is not parallel with the sample surface is produced in the vicinity of a boundary between the metal wiring line part and the insulator part, when the surface of the insulator part is positively charged or when the surface of the insulator part is negatively charged. When secondary electron beams released from a place in the metal wiring line part and a place in the insulator part in the vicinity of the boundary have their trajectories controlled by a secondary optical system and imaged in an MCP detector, the potential gradient brings about improper deflection effects, so that the secondary electron beams deviate from electron beam trajectories ideal for accurate projection, resulting in distorted electron beam trajectories. Consequently, the proper imaging of the secondary beam is prevented, which would be the cause of distortion and a decrease in contrast of a secondary electron beam detected image. This has caused a problem which leads to a decrease in the defect detection performance of the inspection apparatus.

SUMMARY OF THE INVENTION

According to a first aspect of the present invention, there is provided a substrate inspection apparatus comprising:

an electron gun which generates an electron beam to irradiate the electron beam to a substrate;

an electron detection unit which detects at least one of a secondary electron, a reflection electron and a back scattering electron generated from a surface of the substrate by the irradiation of the electron beam to output signals constituting an image showing a state of the substrate surface; and a surface potential uniformizing unit which generates ions, and irradiates the ions to the substrate before the irradiation of the electron beam to uniformize a surface potential of the substrate.

According to a second aspect of the present invention, there is provided a substrate inspection method comprising:

generating an electron beam to irradiate the electron beam to a substrate;

detecting at least one of a secondary electron, a reflection electron and a back scattering electron generated from a surface of the substrate by the irradiation of the electron beam in order to acquire signals constituting an image showing a state of the substrate surface; and generating ions and irradiating the ions to the substrate before the irradiation of the electron beam to uniformize a surface potential of the substrate.

According to a third aspect of the present invention, there is provided a semiconductor device manufacturing method comprising implementing a manufacturing process onto a substrate which is passed through inspection by a substrate inspection method, the substrate inspection method including:

generating an electron beam to irradiate the electron beam to a substrate;

detecting at least one of a secondary electron, a reflection electron and a back scattering electron generated from the surface of the substrate by the irradiation of the electron beam in order to acquire signals constituting an image showing a state of the substrate surface; and generating ions and irradiating the ions to the substrate before the irradiation of the electron beam to uniformize a surface potential of the substrate.

DETAILED DESCRIPTION OF THE INVENTION

An embodiment of the present invention will hereinafter be described in reference to the drawings.

(1) Substrate Inspection Apparatus

Figure 1:
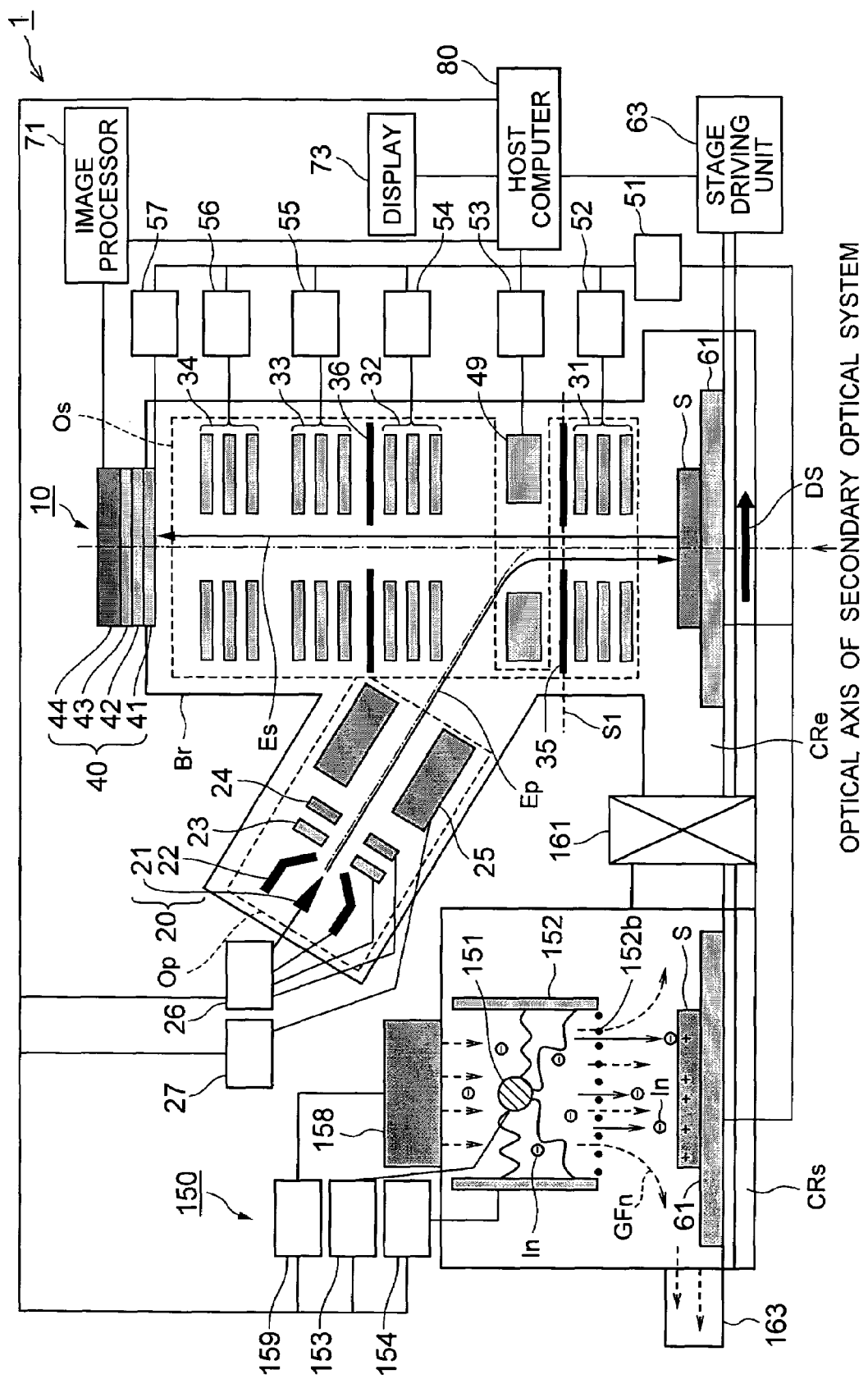
FIG. 1 is a block diagram showing one embodiment of a substrate inspection apparatus according to the present invention.

FIG. 1 is a block diagram showing one embodiment of a substrate inspection apparatus according to the present invention. A substrate inspection apparatus 1 shown in FIG. 1 comprises an electron beam unit 10, and a surface potential uniformizing unit 150 which is characteristic in the present embodiment. The electron beam unit 10 comprises an electron beam unit chamber CRe, an electron beam column Br provided on the chamber CRe, various controllers 26, 27, 51 to 57 and 159, an electron detector 40, an image processor 71, a stage 61 for supporting a wafer substrate S which is a sample, a stage driving unit 63, a host computer 80, a display 73, a surface potential uniformizing unit chamber CRs, and power sources 153 and 154.

The electron beam unit chamber CRe stores the stage 61, and is connected to an unshown vacuum pump so that a high vacuum is maintained in the chamber during an inspection. The electron beam unit chamber CRe is also connected to the surface potential uniformizing unit chamber CRs via a gate valve 161.

The electron beam column Br includes a primary optical system Op, a secondary optical system Os and a Wien filter 49, and the electron detector 40 is disposed on its top surface portion. The primary optical system Op includes an electron gun part 20 and a quadrupole lens 25.

The electron gun part 20 includes $LaB_6$ linear cathode 21 having a rectangular electron releasing surface whose major axis is 100 to 700 μm and whose minor axis is 15 μm, a Wehnelt electrode 22, an anode 23 for drawing an electron beam, and a deflector 24 for optical axis adjustment. The linear cathode 21, the Wehnelt electrode 22, the anode 23 and the deflector 24 are connected to the electron gun controller 26, such that the accelerating voltage, exit current and optical axis of a primary beam Ep are controlled. The quadrupole lens 25 is connected to a quadrupole lens controller 27, and narrows the electron beam in accordance with a control signal of the quadrupole lens controller 27.

The electron beam released from the linear cathode 21 is converged by the quadrupole lenses 25 on a plurality of stages, and obliquely enters the Wien filter 49 as the primary beam Ep. The primary beam Ep is deflected by the Wien filter 49, and travels on a trajectory vertical to the wafer S which is a sample. The primary beam Ep is then subjected to lens effects by a cathode lens 31 which is a rotationally symmetrical electrostatic lens, and vertically irradiated to the sample S.

The substrate S is mounted on the stage 61. The substrate inspection apparatus 1 in the present embodiment employs a stage scan method in which the surface of the substrate S is scanned by the movement of the stage 61, as shown by an arrow Ds in FIG. 1. The stage 61 is connected to the stage voltage controller 51, such that a negative voltage can be irradiated to the substrate S. This mechanism is directed to reduce the damage caused to the substrate S by the irradiation of the primary beam Ep, and to improve the energy of a secondary beam Es constituted of a secondary electron, etc. generated by the irradiation of the primary beam Ep in accordance with the shape/material/potential distribution of the surface of the substrate S.

The secondary optical system Os includes the cathode lens 31 which is a rotationally symmetrical electrostatic lens, a second lens 32, a third lens 33, a fourth lens 34, a numerical aperture 35 disposed in a plane S1 between the Wien filter 49 and the cathode lens 31 and vertical to the optical axis of the secondary optical system, and a field aperture 36 placed between the second lens 32 and the third lens 33.

The cathode lens 31, the second lens 32, the third lens 33 and the fourth lens 34 are connected to and controlled by the secondary optical system lens controllers 52, 54, 55 and 56, respectively, and guide the secondary electron, etc. generated from the surface of the substrate S by the irradiation of the primary beam Ep in order to project and image the secondary electron, etc. as the secondary beam Es. The numerical aperture 35 is disposed at the position of the plane S1 to suppress the magnification chromatic aberration of the secondary beam Es, and one imaging of the secondary beam Es is carried out by the combination of the cathode lens 31 and the second lens 32. Moreover, an area on the substrate S where the primary beam Ep is irradiated is restricted by the numerical aperture 35 in this structure, so that a technique is employed as a solution for this wherein the trajectory of the primary beam from the numerical aperture 35 to the substrate S is controlled under a Koehler illumination system in which the primary beam enters to focus on the numerical aperture 35, and is subjected to the lens effects by the cathode lens 31, and then irradiated vertically to the substrate S.

The electron detector 40 includes an MCP detector 41, a fluorescent plate 42, a light guide 43, and an image pickup device 44 such as a CCD. The secondary beam Es which has entered the MCP detector 41 is amplified by a multi channel plate (MCP) and applied to the fluorescent plate 42. A fluorescent image generated in the fluorescent plate 42 is detected by the image pickup device 44 via the light guide 43, and transferred to the host computer 80 as signals constituting a one-dimensional or two-dimensional image via the image processor 71, and then stored as image data. In addition, defect detection processing such as image processing, the display of the image on the display 73, etc. are carried out.

The host computer 80 is also connected to the various controllers 26, 27, 51 to 57 and 159, the power sources 153 and 154, the image processor 71 and the stage driving unit 63, and controls the whole inspection apparatus via these parts.

The surface potential uniformizing unit 150 is placed in the surface potential uniformizing unit chamber CRs divided from the electron beam unit chamber CRe by the gate valve 161. A gas introduction unit 158 is provided on the top surface of the surface potential uniformizing unit chamber CRs, and a gas flows from the gas introduction unit 158 into the surface potential uniformizing unit chamber CRs and discharged at an exhaust opening 163, as indicated by dotted arrows GFn in FIG. 1. Thus, during surface potential uniformizing processing, the gaseous body is controlled so that it constantly flows without stopping in the surface potential uniformizing unit chamber CRs. The gas inflow unit 158 is connected to the gas inflow unit controller 159, and adjusts the ratio of components and flow volume of the gas in accordance with a control signal sent from the gas inflow unit controller 159.

The surface potential uniformizing unit 150 further includes a first electrode 151 and a second electrode 152 serving as sources of gaseous discharges for generating ions, and the first electrode application power source 153 and the second electrode application power source 154 respectively connected to the electrodes 151 and 152 to apply voltages to the electrodes 151 and 152. In the present embodiment, the first electrode 151 has a shape of a round bar, and the second electrode 152 has a U-shaped section and a meshed bottom surface.

Figure 2:
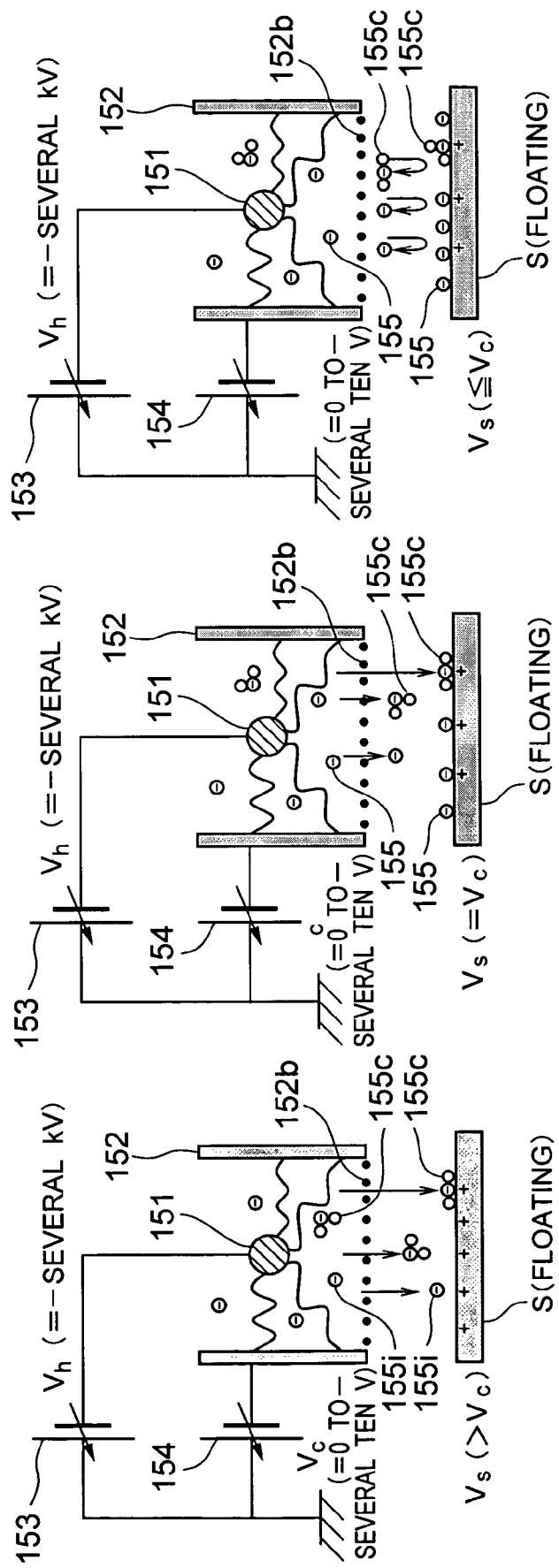
FIGS. 2A to 2C are explanatory diagrams showing an operation principle when the potential of the surface of a substrate is uniformized into a negative potential by a surface potential uniformizing unit provided in the substrate inspection apparatus shown in FIG. 1.
Figure 3:
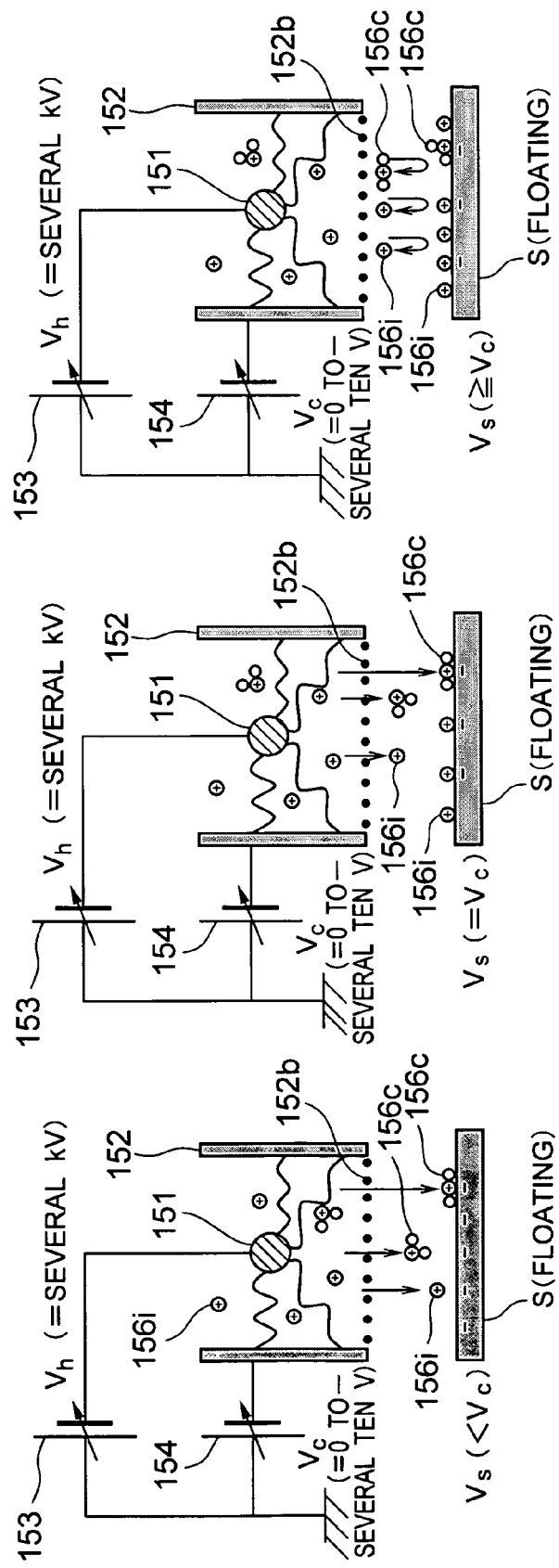
FIGS. 3A to 3C are explanatory diagrams showing an operation principle when the potential of the surface of the substrate is uniformized into a positive potential by the surface potential uniformizing unit provided in the substrate inspection apparatus shown in FIG. 1.

Operation principles of the surface potential uniformizing unit 150 will be described with reference to FIG. 2A to FIGS. 3C. FIGS. 2A to 2C show the operation principle when the potential of the surface of the substrate S is uniformized into a negative potential. FIGS. 3A to 3C show the operation principle when the potential of the surface of the substrate S is uniformized into a positive potential.

First, the operation principle for uniformizing the surface of the substrate S into a negative potential will be described with reference to FIGS. 2A to 2C.

A voltage of Vh (−several kV) is applied from the first electrode application power source 153 to the first electrode 151, and a voltage of Vc (0 to −several ten V) is applied from the second electrode application power source 154 to the second electrode 152, such that a gaseous discharge is caused between the first electrode 151 and the second electrode 152, and the gaseous body in a space between the electrodes ionizes, thereby generating ions or polar cluster particles. Negative ions 155$i$ and negative polar cluster particles 155$c$ among the generated ions travel toward the second electrode 152 owing to an electric field directed from the second electrode 152 to the first electrode 151. The negative ions 155$i$ and the negative polar cluster particles 155$c$ which have proceeded pass through a mesh 152$b$ formed at the bottom of the second electrode 152 and then reach the surface of the substrate S where they exchange charges with positively charged parts of the surface of the substrate S or adhere to the substrate S, such that the potential of the surface of the substrate S is uniformized into a negative potential (FIG. 2A). A surface potential Vs of the substrate S becomes the same as the second electrode applied potential Vc (FIG. 2B), and when the surface potential of the substrate S results in Vs≦Vc (FIG. 2C), an electric field directed from the mesh 152$b$ to the surface of the substrate S is formed, so that the negative ions 155$i$ and the negative polar cluster particles 155$c$ which have passed through the mesh 152$b$ can not reach the surface of the substrate S, and the surface potential of the substrate S is kept at Vs (≈Vc). During this surface potential uniformizing processing, the substrate S needs to be in a floating state.

Next, the operation principle for uniformizing the surface of the wafer substrate S into a positive potential will be described with reference to FIG. 3. Vh (+several kV) is applied from the first electrode application power source 153 to the first electrode 151, and Vc (0 to several ten V) is applied from the second electrode application power source 154 to the second electrode 152, such that a gaseous discharge is caused between the first electrode 151 and the second electrode 152, and the gaseous body in the space between the electrodes ionizes, thereby generating ions or polar cluster particles. Positive ions 156$i$ and positive polar cluster particles 156$c$ among the generated ions travel toward the second electrode 152 owing to an electric field directed from the first electrode 151 to the second electrode 152. The positive ions 156$i$ and the positive polar cluster particles 156$c$ which have proceeded pass through the mesh 152$b$ at the bottom of the second electrode 152 and then reach the surface of the substrate S where they exchange charges with negatively charged parts of the surface of the substrate S or adhere to the substrate S, such that the potential of the surface of the substrate S is uniformized into a positive potential (FIG. 3A). The surface potential Vs of the substrate S becomes the same as the second electrode potential Vc (FIG. 3B), and when the surface potential of the substrate S results in Vs≧Vc (FIG. 3C), an electric field directed from the surface of the substrate S to the mesh 152$b$ is formed, so that the positive ions 156$i$ and the positive polar cluster particles 156$c$ which have passed through the mesh 152$b$ can not reach the surface of the substrate S, and the surface potential of the substrate S is kept at Vs (≈Vc). During this surface potential uniformizing processing, the substrate S needs to be in a floating state, as in the case shown in FIGS. 2A to 2C.

When it is desired to uniformize the surface potential into 0 V, the second electrode voltage Vc can be set at 0 V to carry out the positive charging processing in FIGS. 3A to 3C after the negative charge uniformizing processing in FIGS. 2A to 2C, or the second electrode voltage Vc can be set at 0 V to carry out the negative charge uniformizing processing in FIGS. 2A to 2C after the positive charging processing in FIGS. 3A to 3C.

In the surface potential uniformizing unit 150 of the present embodiment, as a gas species for uniformizing the surface potential, a gas species (e.g., $N_2$) which becomes positive ions can be introduced to obtain a positive surface potential, while a gas species (e.g., $O_2$) which becomes negative ions can be introduced when a negative surface potential is desired. If air containing both positive and negative ion species is introduced, it is possible to configure the apparatus simply and at low cost. However, when a gaseous discharge is caused in the atmosphere, produced nitrogen oxide ($NO_x$) reacts with $H_2O$ in the atmosphere to become $HNO_3$, which adheres to the wafer substrate S and contaminates its surface and might thus decrease the sensitivity of the inspection. In that case, dehydrated air can be introduced into the surface potential uniformizing unit chamber CRs to carry out the uniformizing of the surface potential.

(2) Substrate Inspection Method

Figure 4:
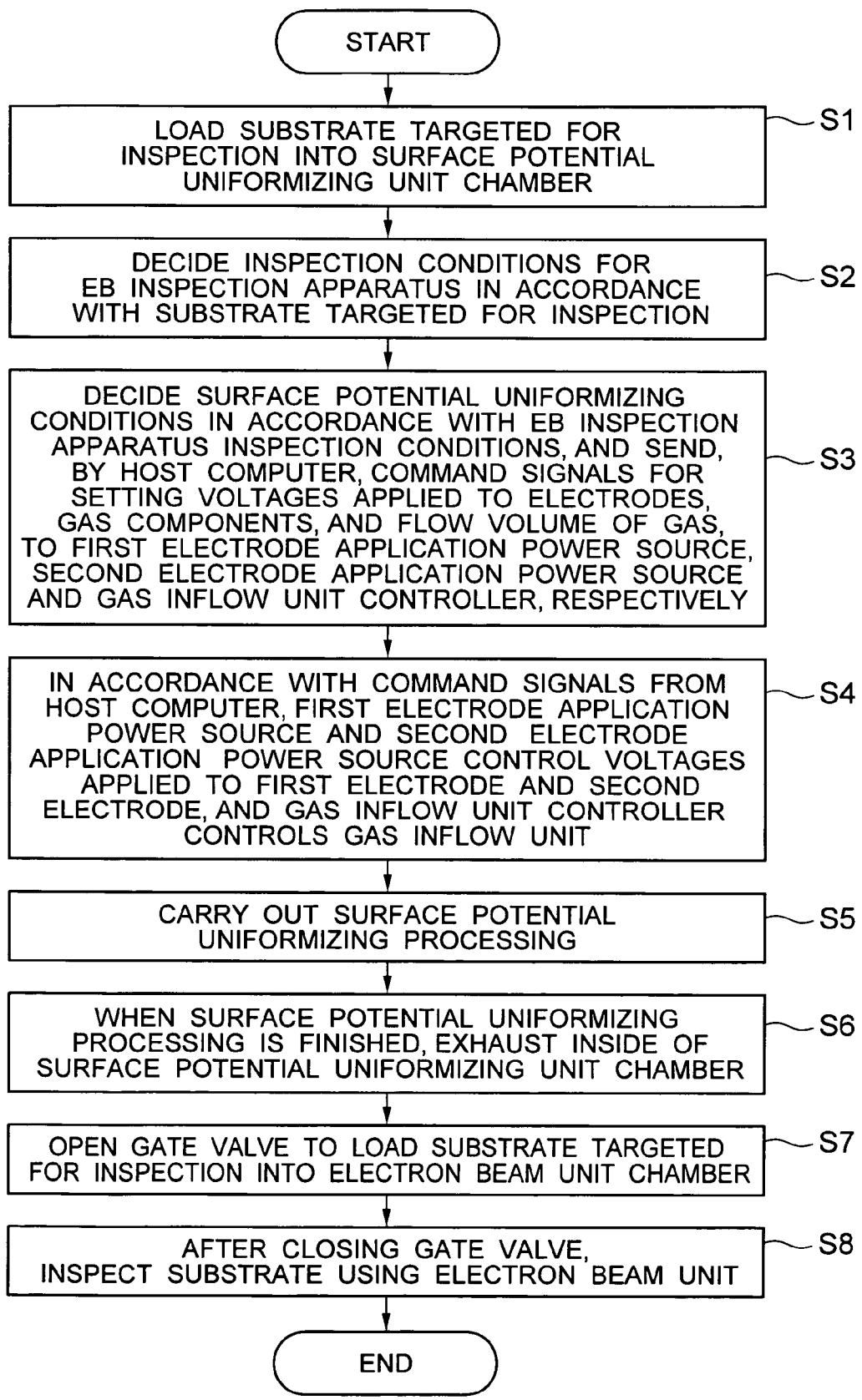
FIG. 4 is a flowchart showing a schematic procedure of a substrate inspection method using the substrate inspection apparatus shown in FIG. 1.

FIG. 4 is a flowchart showing a schematic procedure of the substrate inspection method using the substrate inspection apparatus 1 in the present embodiment. As shown in FIG. 4, the substrate S targeted for inspection is first loaded into the surface potential uniformizing unit chamber CRs (S1). Then, inspection conditions for the EB inspection apparatus are decided in accordance with the layout of the surface of the substrate S targeted for inspection, the material of the surface structure, etc. so that most signals constituting an image can be acquired (S2). Then, since the charged state in the surface of the substrate S targeted for inspection can be estimated from the decided inspection conditions for the EB inspection apparatus, surface potential uniformizing conditions are decided so as not to cause distortion in the image, and command signals for setting voltages applied to the respective electrodes, gas components, and the flow volume of the gas are sent from the host computer 80 to the first electrode application power source 153, the second electrode application power source 154 and the gas inflow unit controller 159 (S3). For example, when the EB inspection conditions are adapted to positive charging conditions, surface negative potential uniform conditions are set so that the surface potential becomes uniformize during the EB inspection. Contrarily, when the electron beam inspection conditions are adapted to negative charging conditions, surface positive potential uniform conditions are set so that the surface potential becomes uniformize during the EB inspection. Then, in accordance with the command signals sent from the host computer 80, voltages are applied from the first electrode application power source 153 and the second electrode application power source 154 to the first electrode 151 and the second electrode 152, and the gas inflow unit 158 is controlled from the gas inflow unit controller 159 (S4). Thus, the surface potential uniformizing processing is carried out (S5). When the surface potential uniformizing processing is finished, the inside of the surface potential uniformizing unit chamber CRs is exhausted (S6). Then, the gate valve 161 is opened to load the substrate S targeted for inspection into the chamber CRe of the electron beam unit 10 (S7). Then, after the gate valve 161 is closed, the substrate S is inspected using the electron beam unit 10 (S8).

Effects according to the substrate inspection method in the present embodiment will be more specifically described with reference to FIGS. 5 to 7.

Figure 5:
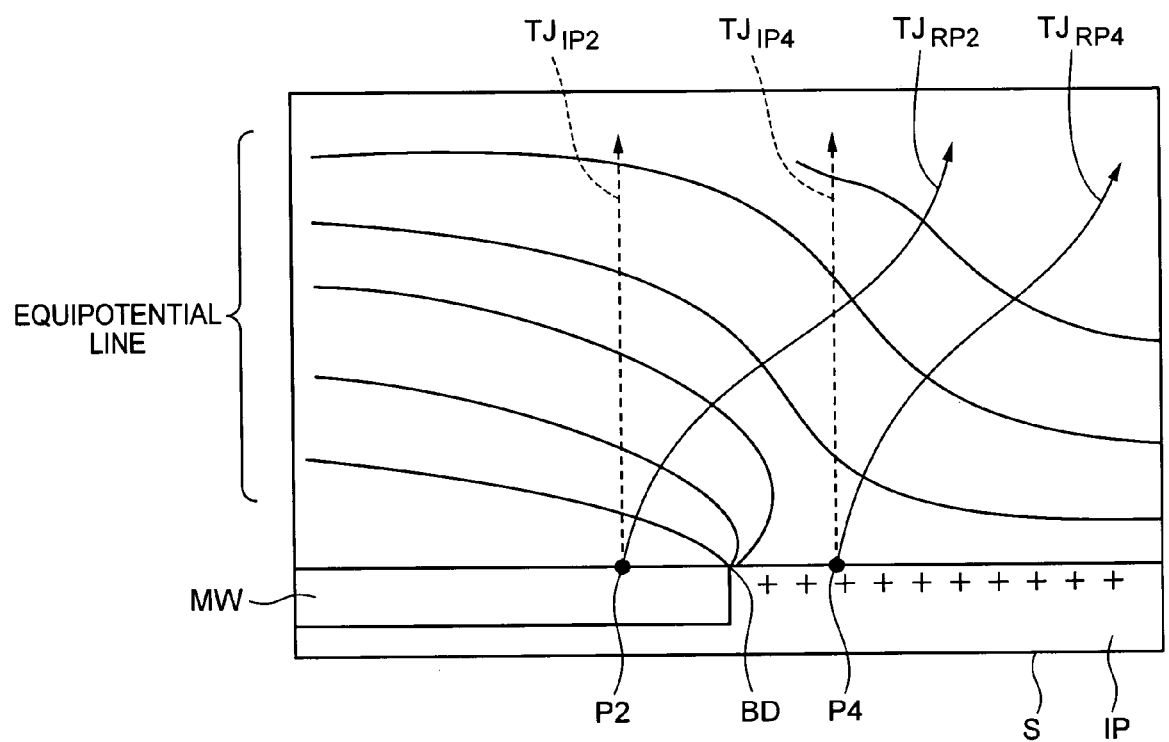
FIGS. 5 and 6 are diagrams explaining problems in a prior art.
Figure 6:
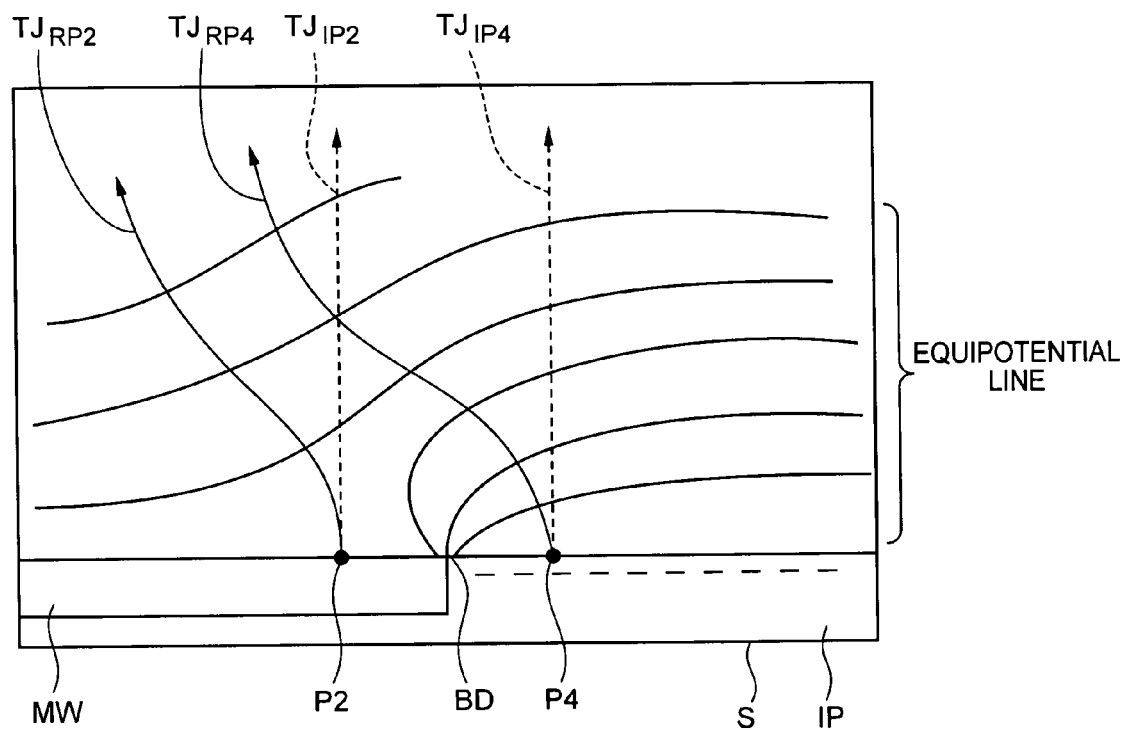

FIGS. 5 and 6 are diagrams explaining problems according to a prior art. As shown in FIGS. 5 and 6, in the surface of an integrated circuit wafer S in which there is a metal wiring line part MW and an inter-wiring-line insulator part IP, a local potential gradient which is not parallel with the surface of the wafer S is produced in the vicinity of a boundary BD between the metal wiring line part MW and the insulator part IP, when the surface of the insulator part IP is positively charged as in FIG. 5 or when the surface of the insulator part IP is negatively charged as in FIG. 6. When secondary electron beams released from a point P2 in the metal wiring line part MW and a point P4 in the insulator part IP in the vicinity of the boundary BD have their trajectories controlled by the secondary optical system Os and imaged in the MCP detector 41, the potential gradient causes improper deflection effects, so that the secondary electron beams deviate from electron beam trajectories ideal for accurate projection such as electron beam trajectories TJ$_{IP2}$ and TJ$_{IP4}$, resulting in distorted electron beam trajectories such as T$_{RP2}$ and TJ$_{RP4}$. Consequently, the imaging of the secondary beam Es is prevented, which causes distortion and a decrease in contrast of a secondary electron beam detected image.

Figure 7:
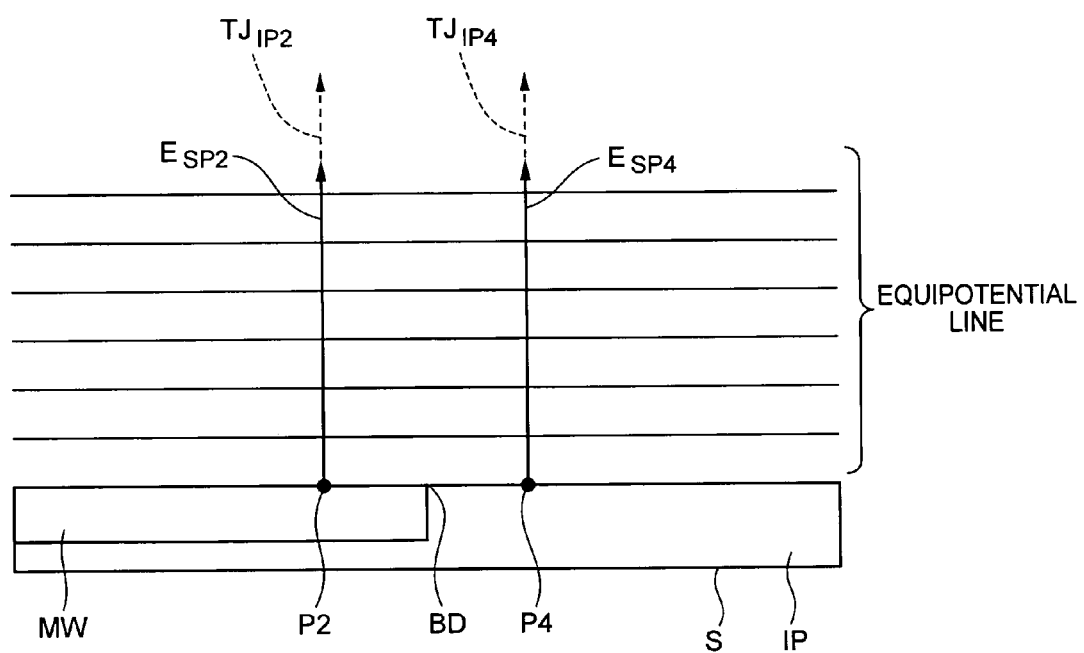
FIG. 7 is a diagram explaining effects of the substrate inspection method shown in FIG. 4.

According to the substrate inspection method in the present embodiment, the potential of the insulator part IP gradually changes from an initial state at+several V or−several V for the metal wiring line part MW, and then becomes the same potential as that of the metal wiring line part MW, as shown in FIG. 7, for example. Secondary beam trajectories Esp2 and Esp4 in this state are the same as the electron beam trajectories TJ$_{IP2}$ and T$_{IP4}$ ideal for accurate projection. As a result, it is possible to acquire a detected image having no distortion and contrast decrease.

(3) Semiconductor Device Manufacturing Method

The use of the substrate inspection method described above in a process of manufacturing a semiconductor device enables the substrate to be inspected with high accuracy, such that the semiconductor device can be manufactured with higher throughput and yield.

More specifically, the semiconductor device is extracted per production lot, and a pattern formed in the extracted semiconductor device is inspected by the substrate inspection method described above. When the semiconductor device is judged as a nondefective product as a result of the inspection, the rest of the manufacturing process is continuously executed for the whole production lot to which the inspected semiconductor device belongs. On the other hand, when the semiconductor device is judged as a defective product as a result of the inspection and can be reworked, rework processing is executed for the production lot to which the semiconductor substrate judged as the defective product belongs. When the rework processing is finished, the semiconductor substrate is extracted from the production lot and again inspected. If the extracted semiconductor substrate is judged as a nondefective product as a result of the reinspection, the rest of the manufacturing process is executed for the production lot finished with the rework processing. In addition, when the rework processing is impossible, the production lot to which the semiconductor substrate judged as the defective product belongs is disposed of, and the cause of the defect is analyzed and fed back to a person in charge of designing, a person in charge of an upstream process or the like.

While the embodiment of the present invention has been described above, it is obvious that the present invention is not limited to the embodiment described above, and can be applied in various manners within the technical scope thereof. For example, the case has been described in the embodiment described above where the projection optical system including the Wien filter is provided, but the present invention is not limited thereto, and can also be applied to electron beam (EB) apparatuses and scanning electron microscope (SEM) apparatuses in general. Further, while the substrate inspection apparatus of a stage scan method has been described, it should be understood that the present invention can also be applied to a substrate inspection apparatus of a beam scan method using a deflector and to a substrate inspection apparatus of these two scan methods. Moreover, the shapes and sizes of the electrodes 151 and 152, etc. can be changed suitably to the specifications of the inspection apparatus and inspection purposes.

What is claimed is:

1. A substrate inspection apparatus comprising:
   an electron gun which generates an electron beam to irradiate the electron beam to a substrate;
   an electron detection unit which detects at least one of a secondary electron, a reflection electron and a back scattering electron generated from a surface of the substrate by the irradiation of the electron beam to output signals constituting an image showing a state of the substrate surface; and
   a uniform surface potential creating unit which generates ions, and irradiates the ions to the substrate prior to the irradiation of the electron beam to create a uniform surface potential of the substrate:
   wherein the uniform surface potential creating unit is configured to form a first electric field to guide the ions to the substrate until the surface potential of the substrate becomes a first potential having a preset value and is configured to form a second electric field whose direction is opposite to that of the first electric field to turn back the irradiated ions from the substrate in replacement of the first electric field, when an absolute value of the surface potential of the substrate becomes congruent with or exceeds an absolute value of the first potential.

2. The substrate inspection apparatus according to claim 1, further comprising:
   a controller which sets a polarity of the ions and an arbitrary value of the surface potential of the substrate in accordance with a charged state of the substrate surface estimated due to the irradiation of the electron beam.

3. The substrate inspection apparatus according to claim 2, wherein the uniform surface potential creating unit includes:
   a first electrode configured to generate the ions by application of a second voltage whose absolute value is more than that of the first voltage to generate, the second voltage having the same polarity as the polarity of the ions; and
   a second electrode which is disposed between the first electrode and the substrate and which is configured to generate the first or second electric field by application of the first voltage and to allow the passage of the ions by the first or second electric field.

4. The substrate inspection apparatus according to claim 1, wherein the uniform surface potential creating unit generates the ions by a gaseous discharge.

5. The substrate inspection apparatus according to claim 4, wherein
the uniform surface potential creating unit includes a gas introduction unit which introduces a gas, and a gas controller which controls components and flow volume of the gas.

6. The substrate inspection apparatus according to claim 1, wherein the electron detection unit has a detection surface which detects at least one of the secondary electron, the reflection electron and the back scattering electron; and
the substrate inspection apparatus further comprises a projection optics which projects at least one of the secondary electron, the reflection electron and the back scattering electron to image the electron on the detection surface.

7. A substrate inspection method comprising:
generating an electron beam to irradiate the electron beam to a substrate;
detecting at least one of a secondary electron, a reflection electron and a back scattering electron generated from a surface of the substrate by the irradiation of the electron beam in order to acquire signals constituting an image showing a state of the substrate surface; and
creating a uniform surface potential of the substrate by generating ions and irradiating the ions to the substrate prior to the irradiation of the electron beam;
wherein creating the uniform surface potential of the substrate comprises:
forming a first electric field to guide the ions to the substrate until a value of the surface potential of the substrate becomes a preset value; and
forming a second electric field whose direction is opposite to that of the first electric field to turn back the irradiated ions from the substrate in replacement of the first electric field, when an absolute value of the surface potential of the substrate becomes congruent with or exceeds an absolute value of the preset value.

8. The substrate inspection method according to claim 7, further comprising:
estimating a state in which the substrate surface is charged due to the irradiation of the electron beam; and
setting a polarity of the ions and an arbitrary value of the surface potential of the substrate in accordance with the estimated charged state.

9. The substrate inspection method according to claim 7, wherein the ions are generated by a gaseous discharge.

10. The substrate inspection method according to claim 9, wherein the ions are generated by use of dehydrated air.

11. The substrate inspection method according to claim 7, further comprising:
projecting at least one of the secondary electron, the reflection electron and the back scattering electron as a secondary beam, and imaging the secondary beam at a position where at least one of the secondary electron, the reflection electron and the back scattering electron is detected.

12. A semiconductor device manufacturing method comprising implementing a manufacturing process onto a substrate which is passed through inspection by a substrate inspection method, the substrate inspection method comprising:
generating an electron beam to irradiate the electron beam to a substrate;
detecting at least one of a secondary electron, a reflection electron and a back scattering electron generated from the surface of the substrate by the irradiation of the electron beam in order to acquire signals constituting an image showing a state of the substrate surface; and
creating a uniform surface potential of the substrate by generating ions and irradiating the ions to the substrate prior to the irradiation of the electron beam;
wherein creating the uniform surface potential of the substrate comprises:
forming a first electric field to guide the ions to the substrate until a value of the surface potential of the substrate becomes a preset value; and
forming a second electric field whose direction is opposite to that of the first electric field to turn back the irradiated ions from the substrate, in replacement of the first electric field, when an absolute value of the surface potential of the substrate becomes congruent with or exceeds an absolute value of the preset value.

13. The semiconductor device manufacturing method according to claim 12,
wherein the substrate inspection method further includes
estimating a state in which the substrate surface is charged due to the irradiation of the electron beam; and
setting a polarity of the ions and an arbitrary value of the surface potential of the substrate in accordance with the estimated charged state.

14. The semiconductor device manufacturing method according to claim 12,
wherein the ions are generated by a gaseous discharge.

15. The semiconductor device manufacturing method according to claim 14,
wherein the ions are generated by use of dehydrated air.

16. The semiconductor device manufacturing method according to claim 12,
wherein the substrate inspection method further includes projecting at least one of the secondary electron, the reflection electron and the back scattering electron as a secondary beam, and imaging the secondary beam at a position where at least one of the secondary electron, the reflection electron and the back scattering electron is detected.

* * * * *